(12) United States Patent
Dyer et al.

(10) Patent No.: US 6,967,335 B1
(45) Date of Patent: Nov. 22, 2005

(54) MANIPULATION SYSTEM FOR MANIPULATING A SAMPLE UNDER STUDY WITH A MICROSCOPE

(75) Inventors: Mark J. Dyer, Richardson, TX (US); Min-Feng Yu, Savoy, IL (US); Ken Bray, Garland, TX (US)

(73) Assignee: Zyvex Corporation, Richardson, TX (US)

( * ) Notice: Subject to any disclaimer, the term of this patent is extended or adjusted under 35 U.S.C. 154(b) by 183 days.

(21) Appl. No.: 10/173,542

(22) Filed: Jun. 17, 2002

(51) Int. Cl.[7] ................................................. G21K 5/10
(52) U.S. Cl. ................................................. 250/442.11
(58) Field of Search ................................ 250/306, 307, 250/310, 442.11

(56) References Cited

U.S. PATENT DOCUMENTS

| | | | |
|---|---|---|---|
| 3,134,942 A | | 5/1964 | Rhodes |
| 3,535,515 A | | 10/1970 | Jones et al. |
| 3,714,423 A | | 1/1973 | Lucas |
| 4,463,257 A | * | 7/1984 | Simpkins et al. ........... 250/310 |
| 4,587,431 A | | 5/1986 | Uemura |
| 4,601,551 A | | 7/1986 | Pettingell et al. |
| 4,729,646 A | | 3/1988 | Clark et al. |
| 4,798,989 A | | 1/1989 | Miyazaki et al. |
| 4,919,001 A | | 4/1990 | Ogiwara et al. |
| 5,036,205 A | | 7/1991 | Clement et al. |
| 5,055,680 A | | 10/1991 | Kesmodel et al. |
| 5,124,645 A | | 6/1992 | Rhoden et al. |

(Continued)

FOREIGN PATENT DOCUMENTS

| | | |
|---|---|---|
| JP | 2001198896 A | 7/2001 |
| JP | 2002033366 A | 1/2002 |
| WO | WO96/13724 | 5/1996 |
| WO | WO96/20495 A | 7/1996 |
| WO | WO 00/10191 | 6/1999 |
| WO | WO01/09965 | 2/2001 |
| WO | WO02/16089 | 2/2002 |

OTHER PUBLICATIONS

Fatikow, et al., "A Flexible Microrobot–Based Microassembly Station," Emerging Technologies and Factory Automation, 1999. Proceedings ETFA '99. 1999 7th IEEE International Conference, Barcelona, Spain 18–21 Oct. 1999, Piscataway, NJ USA, pp. 397–406.
Investment Approaches: Lux NanoSphere: Measurement, Nanotechnology, The Nanotech Report 2001, pp. 122–136.
Technical Data from Klocke Nanotechnik, Dr. Volker Klocke, Aachen, Germany, printed Nov. 2002, 85 pages.
U.S. appl. No. 10/173,543, Min–Feng Yu.
Yu, Minfeng, et al., "Three–dimensional manipulation of carbon nanotubes under a scanning electron microscope", 1999 IOP Publishing Ltd., pp. 244–252.

*Primary Examiner*—John R. Lee
*Assistant Examiner*—Johnnie L. Smith, II
(74) *Attorney, Agent, or Firm*—Haynes and Boone, LLP

(57) ABSTRACT

A system and method are disclosed which enable manipulation of a sample under study with a microscope. In one embodiment, a manipulation system is adaptable for interfacing with any of a plurality of different types of microscopes, such as a transmission electron microscope (TEM) and a scanning electron microscope (SEM), and further comprises at least one manipulation mechanism operable to manipulate a sample. In another embodiment, a manipulation system is capable of being detachably coupled to a microscope, such as a TEM, and comprises a plurality of manipulator mechanisms for manipulating a sample. In a preferred embodiment, the manipulation system comprises both an adjustable interface such that it is capable of selectively coupling with any of a plurality of different microscope interfaces and a plurality of manipulator mechanisms integrated therein that are controllably operable for manipulating a sample.

64 Claims, 7 Drawing Sheets

U.S. PATENT DOCUMENTS

| | | | |
|---|---|---|---|
| 5,225,683 A | 7/1993 | Suzuki et al. | |
| 5,237,238 A | 8/1993 | Berghaus et al. | |
| 5,412,503 A | 5/1995 | Nederlof | |
| 5,455,420 A | 10/1995 | Ho et al. | |
| 5,510,615 A | 4/1996 | Ho et al. | |
| 5,568,004 A | 10/1996 | Kleindiek | |
| 5,635,836 A * | 6/1997 | Kirtley et al. | 324/262 |
| 5,756,997 A | 5/1998 | Kley | |
| 5,922,179 A | 7/1999 | Mitro et al. | |
| 5,939,816 A | 8/1999 | Culp | |
| 6,000,280 A | 12/1999 | Miller et al. | |
| 6,002,136 A | 12/1999 | Naeem | |
| 6,127,681 A | 10/2000 | Sato et al. | |
| 6,127,682 A | 10/2000 | Nakamoto | |
| 6,198,299 B1 | 3/2001 | Hollman | |
| 6,279,389 B1 | 8/2001 | Adderton et al. | |
| 6,346,710 B1 | 2/2002 | Ue | |
| 6,403,968 B1 | 6/2002 | Hazaki et al. | |
| 6,452,307 B1 | 9/2002 | Olin et al. | |
| 6,501,289 B1 | 12/2002 | Takekoshi | |
| 6,538,254 B1 * | 3/2003 | Tomimatsu et al. | 250/442.11 |
| 6,583,413 B1 | 6/2003 | Shinada et al. | |
| 2001/0044158 A1 | 11/2001 | Kelly et al. | |
| 2002/0064341 A1 | 5/2002 | Fauver et al. | |

* cited by examiner

MANIPULATION SYSTEM FOR MANIPULATING A SAMPLE UNDER STUDY WITH A MICROSCOPE

CROSS-REFERENCE TO RELATED APPLICATIONS

This application is related to concurrently filed and commonly assigned U.S. patent application Ser. No. 10/173,543 entitled "MODULAR MANIPULATION SYSTEM FOR MANIPULATING A SAMPLE UNDER STUDY WITH A MICROSCOPE", the disclosure of which is hereby incorporated herein by reference.

TECHNICAL FIELD

The present invention relates in general to a manipulation system for manipulating a sample under study with a microscope, and more particularly to a manipulation system that comprises an interface for detachably coupling with at least one type of microscope, a sample stage for receiving a sample, and at least one manipulator mechanism for manipulating a received sample.

BACKGROUND OF THE INVENTION

Much development is being achieved on the micrometer ($\mu$m) and nanometer (nm) size scales. For example, much work is being performed at these small size scales in such scientific fields as biology, medicine, physics, chemistry, electronics, engineering, and nanotechnology to, for example, study objects (e.g., materials, organisms, viruses, bacteria, etc.), create new objects, and/or assemble objects together with great precision.

To perform manipulation of objects on such a small size scale, it is often necessary to use microscope equipment to aid in observing the objects. For instance, the smallest object that human beings can see with the unaided eye is about 0.1 millimeter (mm). With a good light microscope (also referred to as an "optical microscope"), an image may be magnified up to about 1500 times. However, magnification achievable with light microscopes is limited by the physics of light (i.e., the wavelength of light) upon which the operation of such microscopes is based. For example, light microscopes have relatively limited resolving power (ability to distinguish clearly between two points very close together). The resolving power, $\alpha$, is measured by the angular separation of two point sources that are just detectably separated by the instrument. The smaller this angle, the greater the resolving power. Thus, in general $\alpha=1.22\lambda/D$, where $\lambda$ is the wavelength of the light used and D is the diameter of the objective lens in meters (m). The best resolving power that can be achieved with a light microscope is around 0.2 $\mu$m. Points closer together than this cannot be distinguished clearly as separate points using a light microscope.

Of course, by reducing the wavelength of the radiation used in a microscope to view an object, the resolution obtainable can be increased. Thus, electron microscopes have been developed that use a beam of electrons, rather than light, to study objects too small for conventional light microscopes. Max Knoll and Ernst Ruska constructed the first electron microscope around 1930. In general, electron microscopes use a beam of electrons to irradiate a sample under study, wherein the wavelength of such electron beam (generally resulting from magnetic forces acting on the beam) is much smaller than the wavelength of light used in light microscopes. Accordingly, the amount of magnification (and the resolving power) achievable with an electron microscope is much improved over that of light microscopes.

Modern electron microscopes typically comprise: (1) an electron gun to produce a beam of accelerated electrons; (2) an image producing system that includes electrostatic lenses (e.g., generally formed by electromagnetic or permanent magnets) and metal apertures to confine and focus the electron beam, pass it through, or over, the surface of the specimen and create a magnified image; (3) an image viewing and recording system, which typically includes photographic plates or a fluorescent screen; and (4) a vacuum pump to keep the microscope under high vacuum, as air molecules may deflect electrons from their paths. The development of the electron microscope has had a massive impact on knowledge and understanding in many fields of science. Modern electron microscopes can view detail at the atomic level with sub-nanometer resolution (e.g., 0.1 nm resolution, which is 1000 times better than conventional light microscopes) at up to a million times magnification.

Various different types of electron microscopes have been developed. Such electron microscopes generally work on the above-described principles of using a directed beam of electrons, as opposed to light, for studying samples. One type of electron microscope is the transmission electron microscope (TEM). In a TEM, electrons are transmitted through a thinly sliced specimen and typically form an image on a fluorescent screen or photographic plate. Those areas of the sample that are more dense transmit fewer electrons (i.e., will scatter more electrons) and therefore appear darker in the resulting image. TEMs can magnify up to one million times and are used extensively, particularly in such scientific fields as biology and medicine to study the structure of viruses and the cells of animals and plants, as examples.

Another type of electron microscope is the scanning electron microscope (SEM). In an SEM, the beam of electrons is focussed to a point and scanned over the surface of the specimen. Detectors collect the backscattered and secondary electrons coming from the surface and convert them into a signal that in turn is used to produce a realistic, three-dimensional image of the specimen. During the scanning process, the detector receives back fewer electrons from depressions in the surface, and therefore lower areas of the surface appear darker in the resulting image. SEMs generally require the specimen to be electrically conducting. Thus, specimens that are not conducting are typically coated (e.g., using a sputter coater) with a thin layer of metal (often gold) prior to scanning. SEMs can magnify up to around one hundred thousand times or more and are used extensively, particularly in such scientific areas as biology, medicine, physics, chemistry, and engineering to, for example, study the three-dimensional ("3-D") structure of surfaces from metals and ceramics to blood cells and insect bodies.

In addition to the above-described light and electron microscopes, various other types of microscopes have also been developed to aid in the study of micro- and/or nano-scale objects, including without limitation atomic force microscopes (AFMs), scanning probe microscopes (SPMs), have been developed, such as atomic force microscopes (AFMs), scanning tunnelling microscope (STM), and her field optical scanning microscope (NOSM), as examples. Microscopes have traditionally been used for imaging (e.g., viewing specimens). However, to provide greater utility, a recent trend has been to include a manipulator mechanism that may be used in conjunction with the microscope for manipulating a specimen being imaged by the microscope.

For example, manipulator mechanisms, such as probes, have been developed that are integrated within an SEM for manipulating a sample being imaged by the SEM. For instance, LEO ELECTRON MICROSCOPY LTD. has proposed certain manipulating mechanisms for use with an SEM. Further, manipulator mechanisms, such as probes, have been developed that are integrated within a TEM for manipulating a sample being imaged by the TEM. For instance, NANOFACTORY INSTRUMENTS has proposed certain in situ probes for TEMs.

Further, detachable manipulator mechanisms have been developed that are capable of being removably coupled to a TEM. For instance, NANOFACTORY INSTRUMENTS has proposed such a detachable manipulator mechanism for TEMs. The detachable manipulator mechanism comprises a sample stage for receiving a sample to be imaged by a TEM, and it further comprises one manipulator having an end-effector, such as a probe, for manipulating a sample. The detachable manipulator mechanism also comprises a first actuator mechanism that is operable to provide relatively long-range movement for coarse adjustment of the end-effector, and it further comprises a second actuator mechanism that is operable to provide relatively fine, precise positioning of the end-effector.

Thus, in operation, a sample is arranged on the detachable manipulator mechanism's sample stage, and the detachable manipulator mechanism is then inserted into a TEM's sample chamber. The manipulator mechanism's first actuator mechanism is utilized to initially arrange the end-effector relative to the sample arranged on the sample stage. Such first actuator mechanism may comprise, for example, a long-stepper microactuator that provides relatively long-range movement with relatively coarse precision (e.g., depending on the step resolution of the long-stepper microactuator). Accordingly, the first actuator provides relatively coarse adjustment of the end-effector relative to the sample arranged on the sample stage. Thereafter, the second actuator mechanism may be used to perform relatively fine, precise movement of the end-effector to manipulate the sample arranged on the sample stage.

However, because of the relatively limited size of the sample chamber of commercially available TEMs in which the manipulator mechanism is inserted, such detachable manipulator mechanisms of the existing art have comprised only one manipulator (end-effector) for manipulating a sample. Additionally, such detachable manipulator mechanisms of the existing art have been useable only with TEMs, and thus are not useable with other types of microscopes.

BRIEF SUMMARY OF THE INVENTION

As described above, manipulating mechanisms (e.g., probes) have been developed for use with microscopes, such as SEMs and TEMs, in order to allow manipulation of a sample being imaged by such microscopes. Such manipulating mechanisms have traditionally been developed for use with a specific type of microscope. For example, manipulating mechanisms that are developed for use in an SEM are not useable in TEMs, and vice-versa. Further, manipulating mechanisms that are developed for one SEM (e.g., a first model) may not be useable in a different type of SEM (e.g., a different model). Accordingly, manipulating mechanisms of the existing art have lacked the flexibility of being interchangeably implemented with different types of microscope interfaces. That is, manipulating mechanisms of the existing art have lacked a flexible interface that is readily adaptable for use with different types of microscopes.

Further, detachable manipulating mechanisms have been developed for TEMs, but such detachable manipulator mechanisms comprise only a single manipulator (or "end-effector") for manipulating a sample.

Accordingly, a desire exists for a "universal" manipulator mechanism that is capable of being used by any of a plurality of different types of microscopes. That is, a desire exists for a manipulator mechanism that comprises an interface that is adaptable to enable such manipulator mechanism to interface with any of a plurality of different types of microscope interfaces. Preferably, such a manipulator mechanism would be capable of interfacing with any of a plurality of different types of microscopes in a manner that does not otherwise interfere with the normal operation (e.g., imaging functionality) of such microscope. Thus, such a manipulator mechanism would preferably be interfaced to a microscope, such as an SEM or TEM as examples, to provide manipulation capability, but would not interfere with a user desiring to utilize the standard functionality (e.g., imaging functionality) of the microscope. Further, a desire exists for a detachable manipulator mechanism that is capable of being detachably coupled to a microscope, such as a TEM and/or SEM, and that comprises a plurality of manipulators that are controllably operable to manipulate a sample under study with such microscope.

The present invention is directed to a system and method which enable manipulation of a sample under study with a microscope. According to at least one embodiment of the present invention, a manipulation system is adaptable for interfacing with any of a plurality of different types of microscopes. For instance, according to one embodiment of the present invention, a manipulation system comprises an interface that is adjustable to comply with a plurality of different microscope interfaces. The manipulation system further comprises at least one manipulation mechanism operable to manipulate a sample.

According to one embodiment of the present invention, a portable sample holder for holding a sample for presentation to a microscope is provided. The portable sample holder comprises a stage for receiving a sample, at least one manipulation mechanism for manipulating a received sample, and an interface for coupling with a microscope. In certain embodiments, the portable sample holder comprises a plurality of manipulation mechanisms for manipulating a received sample. For example, in one embodiment the portable sample holder comprises at least four of such manipulation mechanisms. Having a plurality of manipulation mechanisms enables a variety of measurements to be acquired for a sample that have traditionally been unavailable. Further, in certain embodiments, the interface of the portable sample holder is adaptable to conform to a plurality of different types of microscope interfaces. For example, in one embodiment, the interface is adaptable to conform at least to a transmission electron microscope (TEM) interface and a scanning electron microscope (SEM) interface.

Additionally, according to one embodiment of the present invention, a method of using a microscope to study a sample is provided. The method comprises selecting a desired type of a plurality of different types of microscopes, each of the plurality of different types of microscopes having a different type of interface for receiving a sample holder. The method further comprises adjusting an interface of a sample holder to conform to the interface of the desired type of microscope, wherein said sample holder's interface is adjustable to conform to any of the different types of microscope interfaces for receiving a sample holder. The method further comprises arranging a sample on the sample holder, and interfacing the sample holder with the desired type of microscope such that the sample can be imaged by such desired type of microscope. In certain embodiments, the sample holder comprises at least one manipulation mechanism, and the method further comprises manipulating the sample using such manipulation mechanism(s).

Thus, certain embodiments of the present invention provide a manipulation system with great flexibility in that it may be utilized with any of a plurality of different types of microscopes. Certain embodiments provide a manipulation system that is integrated within a sample holder, and the sample holder comprises an adjustable interface that enables such sample holder to be coupled to any of a plurality of different microscopes that have different interfaces for receiving such sample holder.

The manipulation system of embodiments of the present invention is preferably capable of interfacing with a plurality of different types of microscopes in a manner that does not otherwise interfere with the normal operation (e.g., imaging functionality) of such microscope. Thus, the manipulation system may preferably be interfaced to a microscope, such as an SEM or TEM as examples, to provide the ability to manipulate a sample under study, but does not interfere with a user desiring to utilize the standard functionality (e.g., imaging functionality) of the microscope.

According to at least one embodiment of the present invention a manipulation system that is capable of being detachably coupled to a microscope is provided that comprises a plurality of manipulator mechanisms for manipulating a sample. For example, according to at least one embodiment a sample holder comprises a plurality of manipulator mechanisms that each includes an end-effector and an actuator mechanism for imparting movement to such end-effector. Preferably, such actuator mechanism is operable for imparting relatively precise movement (e.g., with nanometer-scale or better precision) to the end-effector for manipulating a sample under study with a microscope. In operation, an adjustment mechanism that is independent from the sample holder may be used to perform relatively coarse adjustment of the sample holder's end-effector(s) in order to initially position such end-effector(s). Thereafter, the sample holder may be interface with a microscope (e.g., may be inserted in the sample chamber of a microscope), and the sample holder's actuators may be used to impart movement to its end-effectors in order to precisely position such end-effectors for manipulating a sample under study with the microscope.

For instance, according to one embodiment, a system comprises a sample holder that includes a sample stage for receiving a sample, an interface for coupling the sample holder with a microscope such that a sample received on the sample stage can be imaged by the microscope, and a plurality of manipulator means for manipulating a received sample. Preferably, each of such plurality of manipulator means comprises an end-effector, and multiple ones of such manipulator means each comprises an actuator means for imparting precise movement to its respective end-effector from an initial position to a desired position. The system may further comprise an adjustment means that is independent from the sample holder, wherein such adjustment means is operable for coarsely adjusting at least one of the sample holder's manipulator mechanisms to position such manipulator mechanism's end-effector to an initial position.

Thus, certain embodiments of the present invention provide a manipulation system that comprises an interface for detachably coupling with a microscope and further comprises a plurality of manipulator mechanisms for manipulating a sample. Preferably, each of the plurality of manipulator mechanisms comprises an end-effeotor and an actuator for imparting to such end-effector. Preferably, each of the actuators are independently operable in order to enable independent movement of the plurality of end-effectors included in the manipulation system. Such manipulation system may, in certain embodiments, be integrated within a sample holder that is comprises an interface for being detachably coupled to a microscope's sample chamber.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
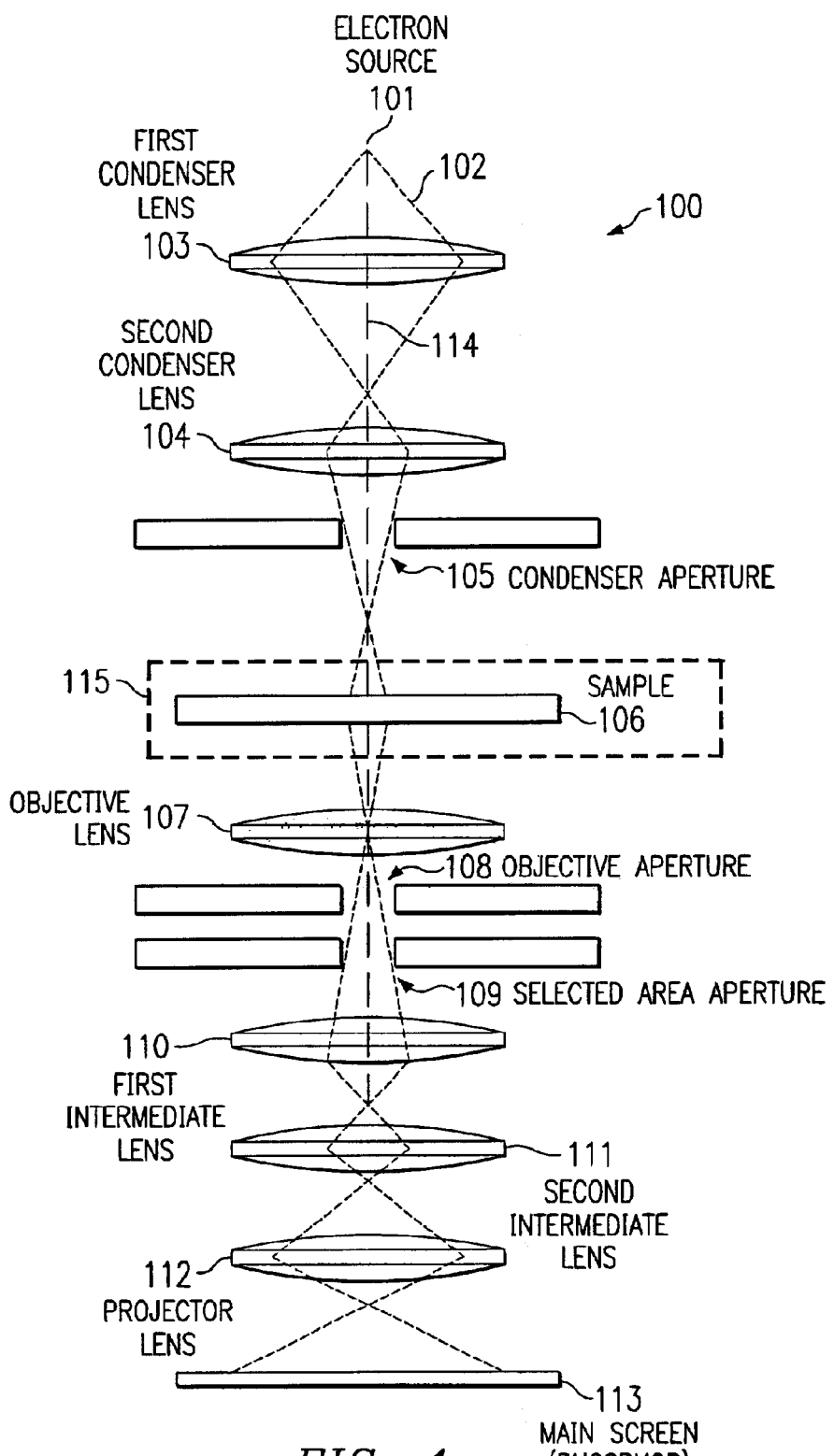
FIG. 1 shows a typical configuration of a TEM.

Various embodiments of the present invention are now described with reference to the above figures, wherein like reference numerals represent like parts throughout the several views. According to certain embodiments of the present invention, a manipulation system is provided that comprises an interface for a plurality of different types of microscopes. For example, the manipulation system preferably comprises an adjustable interface that is adaptable for compliance with any of a plurality of different types of microscopes. In one embodiment, the manipulation system comprises an interface that is adaptable for use at least with a plurality of different types of electron microscopes, such as SEMs and TEMs. In certain embodiments, the manipulation system comprises an interface that is adaptable for use with other types of microscopes in addition to or instead of electron microscopes.

The manipulation system further comprises at least one manipulation mechanism for manipulating a sample (or "specimen") being imaged by a microscope to which the manipulation system is coupled. Such manipulation mechanism may comprise any of various types of manipulation mechanisms, including without limitation probe(s) (including piezoelectric or cantilever force probes, or thermal probes, as examples), gripper(s), glass fiber(s), hypodermic needle(s), and hose(s) for manipulating a sample under study with the microscope. Most preferably, the manipulation system comprises a plurality of manipulation mechanisms for manipulating a sample under study. Preferably, the manipulation mechanism(s) are controllably operable to perform nanometer-scale manipulation (which may be referred to herein as "nanomanipulation"). For example, the manipulation mechanism(s) are preferably controllably moveable (e.g., via an actuation mechanism coupled hereto) with nanometer-scale precision.

"Manipulation" is used herein in its broadest sense, and is not intended to be limited solely to actions that result in a change in the sample under study. Rather, certain types of manipulation may not alter the sample at all, but may instead aid in observing the sample (e.g., measuring certain characteristics of the sample). For example, Webster defines "manipulate" as "to treat or operate with the hands or by mechanical means especially in a skillful manner". MERRIAM-WEBSTER'S COLLEGIATE DICTIONARY, Deluxe Edition, 1998 (ISBN 0-87779-714-5). As used herein, the term "manipulate" (as well as variances thereof, such as "manipulation", etc.) is intended to encompass Webster's definition in that it includes "treating" or "operating" on a sample, which does not necessarily result in a modification to the sample (but may instead simply aid in observing a characteristic thereof). However, as described further below, the types of manipulation are not intended to be limited to being performed by "mechanical means", but are also intended to encompass various other types of manipulating means, such as electrical means, etc.

In certain embodiments of the present invention, the manipulation system comprises a sample holder that includes a stage on which a sample is received to be imaged by a microscope and/or manipulated by manipulation mechanism(s). The sample holder further comprises at least one manipulation mechanism that is controllably operable for manipulating a sample arranged on the stage while such sample is being imaged by a microscope to which the sample holder is coupled. Preferably, such at least one manipulation mechanism is operable with nanometer-scale precision (or better, e.g., sub-nanometer-scale precision). Thus, certain embodiments of the present invention comprise a sample holder that is capable of coupling to a microscope, wherein such sample holder comprises manipulation mechanism(s) integrated therewith.

The sample holder preferably comprises an adjustable interface that is adaptable to enable the sample holder to be removably coupled to a plurality of different types of microscopes. Thus, in operation, a sample to be imaged and/or manipulated is arranged on a stage of the sample holder. The sample holder's interface may be adjusted, if necessary, to enable the sample holder to be coupled to a microscope of choice (e.g., a TEM, SEM, etc.), and the sample holder is then coupled to such microscope of choice. The manipulation mechanism(s) included in the sample holder may then be used to manipulate the sample while such sample is being imaged by the microscope. Thereafter, the sample holder may be removed from the microscope, and its interface may be adjusted to enable such sample holder to be coupled to a different type of microscope that has a different type of interface for receiving such sample holder.

Thus, certain embodiments of the present invention provide a manipulation system with great flexibility in that it may be utilized with any of a plurality of different types of microscopes. As briefly described above, certain embodiments provide a manipulation system that is integrated within a sample holder, and the sample holder comprises an adjustable interface that enables such sample holder to be coupled to any of a plurality of different microscopes that have different interfaces for receiving such sample holder.

The manipulation system of certain embodiments of the present invention is preferably capable of interfacing with a plurality of different types of microscopes in a manner that does not otherwise interfere with the normal operation (e.g., imaging functionality) of such microscope. Thus, the manipulation system may preferably be interfaced to a microscope, such as an SEM or TEM as examples, to provide the ability to manipulate a sample under study, but does not interfere with a user desiring to utilize the standard functionality (e.g., imaging functionality) of the microscope.

According to certain embodiments of the present invention a manipulation system that is capable of being detachably coupled to a microscope is provided that comprises a plurality of manipulator mechanisms for manipulating a sample. For example, according to at least one embodiment a sample holder comprises a plurality of manipulator mechanisms tat each includes an end-effector and an actuator mechanism for imparting movement to such end-effector. Preferably, such actuator mechanism is operable for imparting relatively precise movement (e.g., with nanometer-scale or better precision) to the end-effector for manipulating a sample under study with a microscope. In operation, an adjustment mechanism that is independent from the sample holder may be used to perform relatively coarse adjustment of the sample holder's end-effector(s) in order to initially position such end-effector(s). Thereafter, the sample holder may be interface with a microscope (e.g., may be inserted in the sample chamber of a microscope), and the sample holder's actuators may be used to impart movement to its end-effectors in order to precisely position such end-effectors for manipulating a sample under study with the microscope.

Thus, certain embodiments of the present invention provide a manipulation system that comprises an interface for detachably coupling with a microscope and further comprises a plurality of manipulator mechanisms for manipulating a sample. Preferably, each of the plurality of manipulator mechanisms comprises an end-effector and an actuator for imparting movement to such end-effector. Preferably, each of the actuators are independently operable in order to enable independent movement of the plurality of end-effectors included in the manipulation system. Such manipulation system may, in certain embodiments, be integrated within a sample holder that is comprises an interface for being detachably coupled to a microscope's sample chamber.

As described above, microscopes play a vital role in analyzing and otherwise working with samples at a micrometer and/or nanometer scale. Various different types of microscopes, including without limitation light microscopes, electron microscopes (e.g., TEMs, SEMs, etc.), and SPMs have been developed for studying samples at such small size scales. While alternative embodiments of the present invention may be applied to any one or more types of microscopes now known or later developed, preferred embodiments of the present invention are applicable to electron microscopes. Accordingly, to better understand some of the advantages offered by certain embodiments of the present invention, examples of electron microscopes available in the existing art are described in greater detail hereafter in conjunction with FIGS. 1-2. More particularly, a typical configuration of a TEM is described with FIG. 1, and a typical configuration of an SEM is described with FIG. 2. Specific examples of a preferred embodiment of a manipulation system that comprises a plurality of manipulating mechanisms and/or an adaptable interface that enables it to be selectively coupled to either an SEM or a TEM are described in greater detail herein below in conjunction with Figs 3A–3B, 5, and 6.

While typical configurations of a TEM and SEM are described below in conjunction with FIGS. 1-2, it should be understood that embodiments of the present invention are not limited to the example configurations described. Rather, certain embodiments of the present invention may be utilized with other configurations of TEMs and SEMs now known or later developed. Additionally, while at least one embodiment provides a manipulation system that is capable of being utilized with any of a plurality of different types of electron microscopes (e.g., TEMs and SEMs), certain other embodiments of the present invention may comprise an adaptable interface that enables such manipulation system to be utilized with one or more other types of microscopes now known or later developed in addition to or instead of electron microscopes. Furthermore, while at least one embodiment provides a manipulation system that comprises a an interface for detachably coupling with an electron microscope (e.g., a TEM and/or an SEM) and also comprises a plurality of manipulating mechanisms, in certain other embodiments of the present invention such manipulation system may comprise an interface for detachably coupling with one or more other types of microscopes now known or later developed in addition to or instead of an electron microscope.

As described briefly above, electron microscopes are scientific instruments that use a beam of highly energetic electrons to examine specimens on a very fine scale. This examination can yield a great deal of information, including the following: (1) Topography: the surface features of a specimen or "how it looks", its texture; direct relation between these features and materials properties (hardness, reflectivity, etc.); (2) Morphology: the shape and size of the particles making up the specimen; direct felation between these structures and materials properties (ductility, strength, reactivity, etc.); (3) Composition: the elements and compounds that the specimen is composed of and the relative amounts of them; direct relationship between composition materials properties (melting point, reactivity, hardness, etc.); and (4) Crystallographic Information: how the atoms are arranged in the specimen; direct relation between these arrangements and materials properties (conductivity, electrical properties, strength, etc.).

Electron microscopes were developed due to the limitations of light microscopes, which are limited by the physics of light (i.e., the wavelength of light) to 500x or 100x magnification and a resolution of 0.2 $\mu$m. In the early 1930's this theoretical limit had been reached with light microscopes, and there was a scientific desire to see the fine details of the interior structures of organic cells (nucleus, mitochondria, etc.). This required 10,000x plus magnification, which was not possible to achieve using light microscopes. To overcome the limitations of light wavelengths utilized in light microscopes, electron microscopes were developed that utilize a beam of electrons to irradiate the specimen.

In general, electron microscopes function much like light microscopes, except they use a focused beam of electrons instead of light to "image" the specimen and gain information as to its structure and composition. The operation of electron microscopes generally involves the following: (1) a stream of electrons is formed (e.g., by an electron source) and accelerated toward the specimen using a positive electrical potential; (2) this stream is confined and focused using metal apertures and magnetic lenses into a thin, focused, monochromatic beam; (3) this beam is focused onto the sample using electrostatic lenses (generally magnetic lenses); and (4) interactions occur inside the irradiated sample, affecting the electron beam.

Turning first to FIG. 1, a schematic of an example configuration of a TEM 100 is shown. The TEM was the first type of electron microscope to be developed, and is patterned on the Light Transmission Microscope, except that a focused beam of electrons is used instead of light to "see through" the specimen. A TEM works much like a slide projector. A slide projector shines a beam of light through (transmits) the slide, as the light passes through the slide it is affected by the structures and objects on the slide. These effects result in only certain parts of the light beam being transmitted through certain parts of the slide. This transmitted beam is then projected onto the viewing screen, forming an enlarged image of the slide. TEMs generally work much the same way, except that they shine a beam of electrons (rather than light) through the specimen (as with the slide in a slide projector system). Whatever part is transmitted is typically projected onto a phosphor screen for the user to see. A more technical explanation of a typical TEM is described further below in conjunction with FIG. 1.

As shown in the example configuration of FIG. 1, TEM 100 comprises an electron source 101, which may comprise an electron gun, for producing a stream of monochromatic electrons 102. The stream 102 is focused to a small, thin, coherent beam by the use of condenser lenses 103 and 104. The first condenser lens (103), which is usually controlled by the "spot size knob" (not shown) of the TEM, largely determines the "spot size" (i.e., the general size range of the final spot that strikes the sample). The second lens (104), which is usually controlled by the "intensity or brightness knob" (not shown) of the TEM, actually changes the size of the spot on the sample (e.g., changing it from a wide dispersed spot to a pinpoint beam). The beam 102 is restricted by the condenser aperture 105 (usually user selectable), knocking out high angle electrons (e.g., those far from the optic axis 114). The beam 102 strikes the sample (or "specimen") 106 and parts of it are transmitted. This transmitted portion of beam 102 is focused by the objective lens 107 into an image.

Optional objective and selected area metal apertures (labeled 108 and 109, respectively) may be included to restrict the beam. The objective aperture 108 may enhance contrast by blocking out high-angle diffracted electrons, and the selected area aperture 109 may enable the user to examine the periodic diffraction of electrons by ordered arrangements of atoms in the sample 106. The image is passed down the colunm through the intermediate and projector lenses 110, 111, and 112, being enlarged along the way. The image strikes the phosphor image screen 113 and light is generated, allowing the user to see the image. Typically, the darker areas of the image represent those areas of the sample 106 through which fewer electrons were transmitted (i.e., areas of the sample 106 that are thicker or denser), and the lighter areas of the image represent those areas of the sample 106 through which more electrons were transmitted (i.e., areas of the sample 106 that are thinner or less dense).

As further shown in the schematic of FIG. 1, a TEM typically comprises a sample chamber 115 into which a sample 106 is placed for imaging. For instance, a sample holder that is removable from chamber 115 may comprise a stage on which sample 106 may be placed. Thus, sample 106 maybe placed on the stage of a sample holder, and the sample holder may then be inserted into sample chamber 115. Sample chamber 115 comprises a defined interface for receiving such a sample holder. For example, sample chambers of commercially available TEMs typically comprise an interface to accept a standard TEM sample holder of 3 mm in thickness, 9 mm in width and about 9 centimeters (cm) in length for loading a thin sample generally having approximately 3 mm in diameter.

Figure 2:
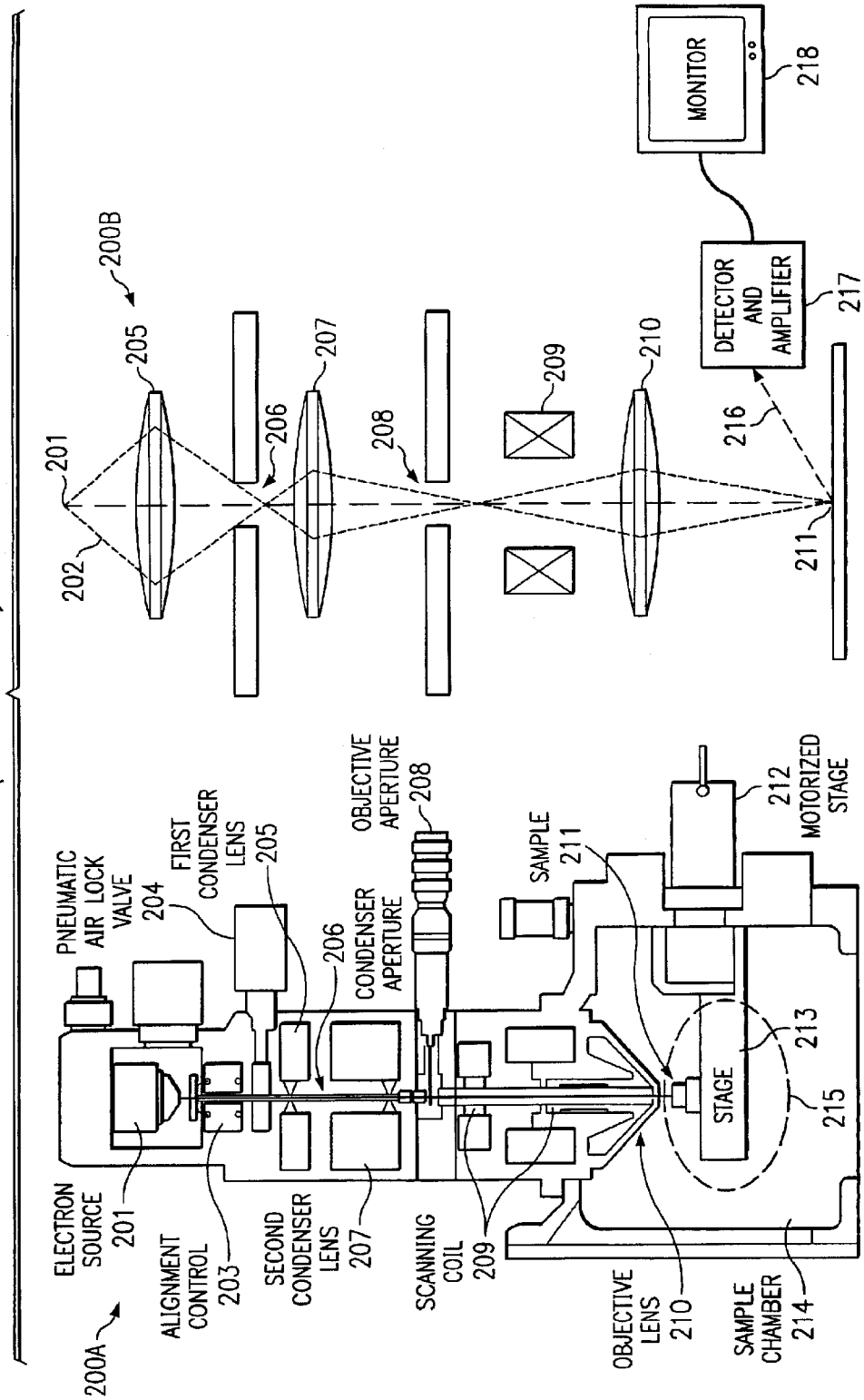
FIG. 2 shows a typical configuration of an SEM.

Turning to FIG. 2, an example configuration of an SEM is shown. FIG. 2 shows a high-level block diagram 200*a* and a schematic representation 200*b* of a typical configuration of an SEM. As shown, SEM 200 comprises an electron source 201, which may comprise an electron gun, for producing a stream of monochromatic electrons 202. Alignment control 203 is utilized to align the direction of the generated stream 202 with the below-described components of the SEM.

The stream 202 is condensed by the first condenser lens 205, which is usually controlled by the "c oarse probe current knob" (not shown) of the SEM. This lens 205 is used to both form the beam and limit the amount of current in the beam. It works in conjunction with the condenser aperture 206 to eliminate the high-angle electrons from the beam. The beam is constricted by the condenser aperture 206 (usually not user selectable), eliminating some high-angle electrons. The second condenser lens 207 forms the electrons 202 into a thin, tight, coherent beam and is usually controlled by the "fine probe current knob" (not shown) of the SEM.

A user-selectable objective aperture 208 further eliminates high-angle electrons from the beam. A set of coils 209 then "scan" or "sweep" the beam in a grid fashion, dwelling on points for a period of time determined by the scan speed (usually in the microsecond range). The final lens, the objective lens 210, focuses the scanning beam onto the part of the sample (or specimen) 211, as desired. When the beam strikes the sample 211 (and dwells for a few microseconds) interactions occur inside the sample and are detected with various instruments. For instance, as shown in the schematic diagram 200*b*, secondary and/or backscattered electrons 216 are detected and amplified by detector and amplifier 217. Before the beam moves to its next dwell point, these instruments (e.g., detector and amplifier 217) essentially count the number of interactions and display a pixel on a display 218 (e.g., cathode ray tube (CRT)) whose intensity is determined by the counted number of interactions (e.g., the more reactions the brighter the pixel). This process is repeated until the grid scan is finished and may then be repeated. The entire pattern may be scanned 30 times per second, for example. Thus, the resulting image on display 218 may comprise thousands of spots (or pixels) of varying intensity that correspond to the topography of the sample 211.

As further shown in the block diagram 200*a*, an SEM typically comprises a sample chamber 214 into which a sample 211 is placed for imaging. For instance, a sample holder that is removable from chamber 214 may comprise stage 213 on which sample 211 may be placed. Thus, sample 211 may be placed on stage 213 of a sample holder, and the sample holder may then be inserted into sample chamber 214. Sample chamber 214 comprises a defined interface 215 for receiving such a sample holder. The defined interface 215 for an SEM is generally different than the defined interface of a TEM's sample chamber, such as the interface described above with FIG. 1 for sample chamber 115 of TEM 100. For example, SEM sample chambers typically comprise an interface to accept relatively large samples, if needed, in the space allowed inside the chamber, such as 15 cm by 15 cm by 6 cm. Usually, motorized stage 212 is included in the SEM to enable movement of stage 213 within sample chamber 214. Also, pneumatic air lock valve 204 is typically utilized to create a vacuum within the SEM once a sample 211 has been inserted into sample chamber 214, as air molecules may deflect electrons of the generated beam from their intended paths.

Figure 3A:
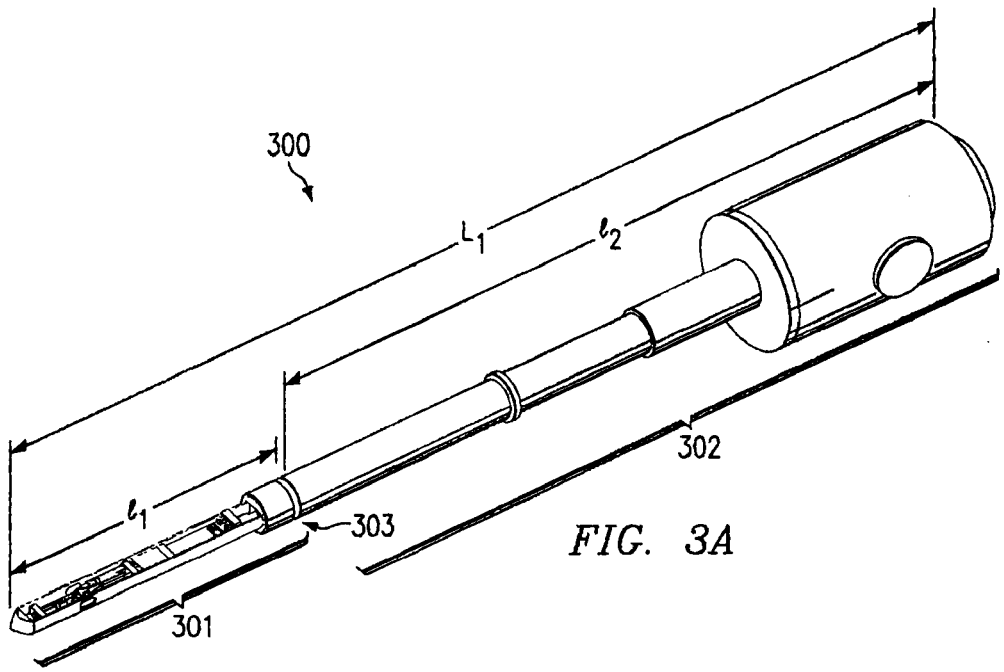
FIGS. 3A–3B show an example configuration of a manipulation system in accordance with a preferred embodiment of the present invention.
Figure 3B:
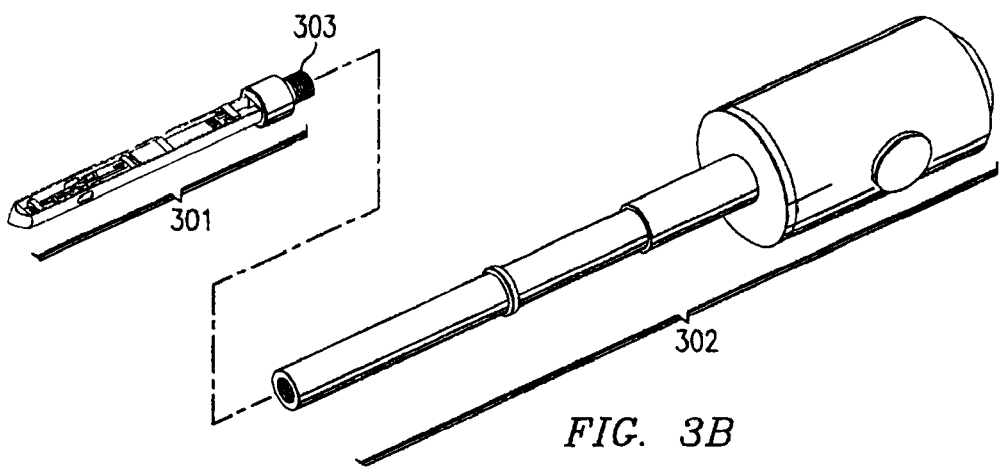

Turning now to FIGS. 3A–3B, an example configuration of a preferred embodiment of the present invention is shown. That is, FIGS. 3A–3B show at least a portion of a manipulation system of a preferred embodiment, which includes a sample holder 300. The example configuration of sample holder 300 shown in FIG. 3A comprises a first portion 301 and a second portion 302

Figures 4A, 4B:
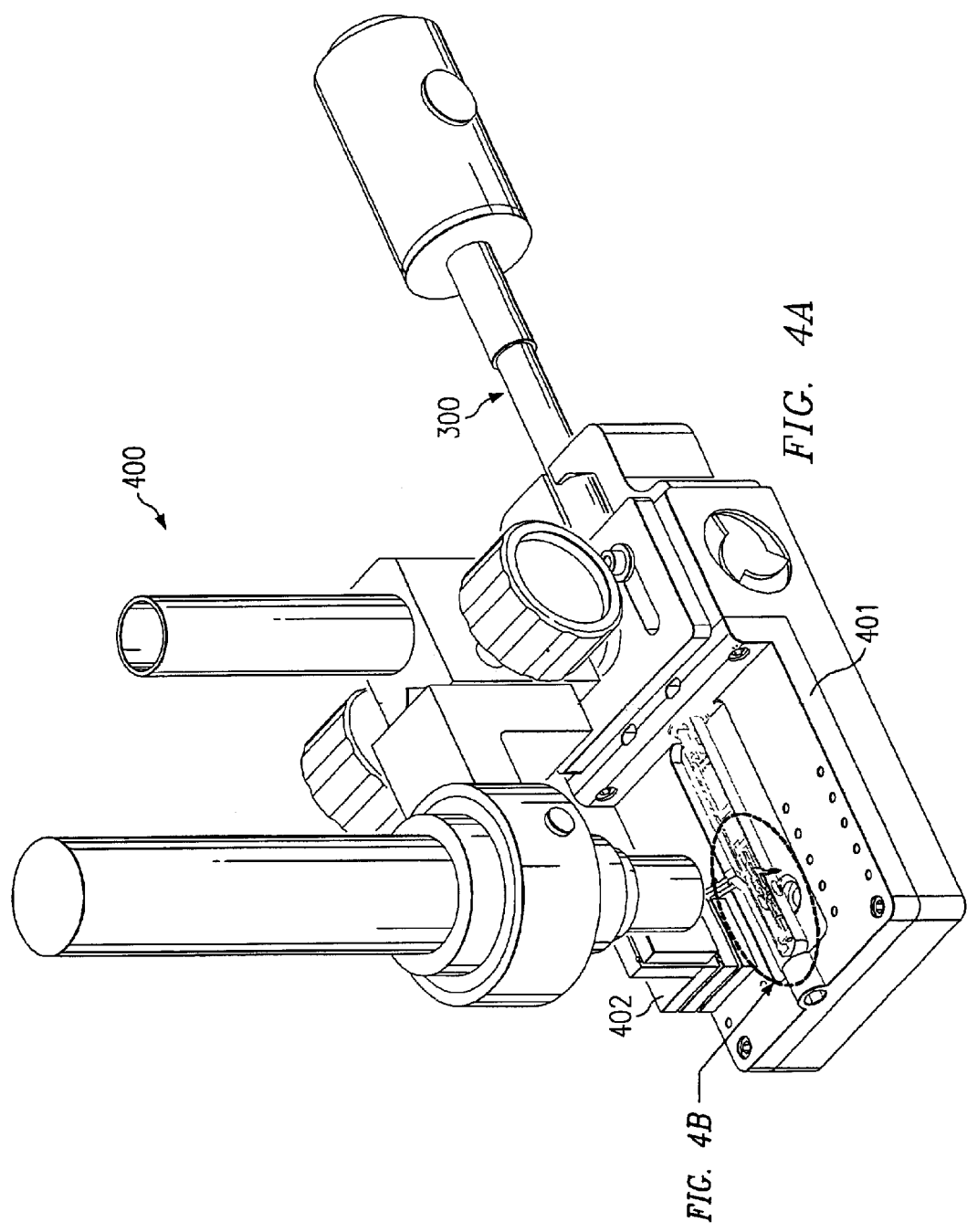
FIGS. 4A–4B show a preferred embodiment of a manipulation system coupled to a light microscope to enable relatively coarse positioning of its manipulation mechanism(s) relative to a sample.
Figure 4B:
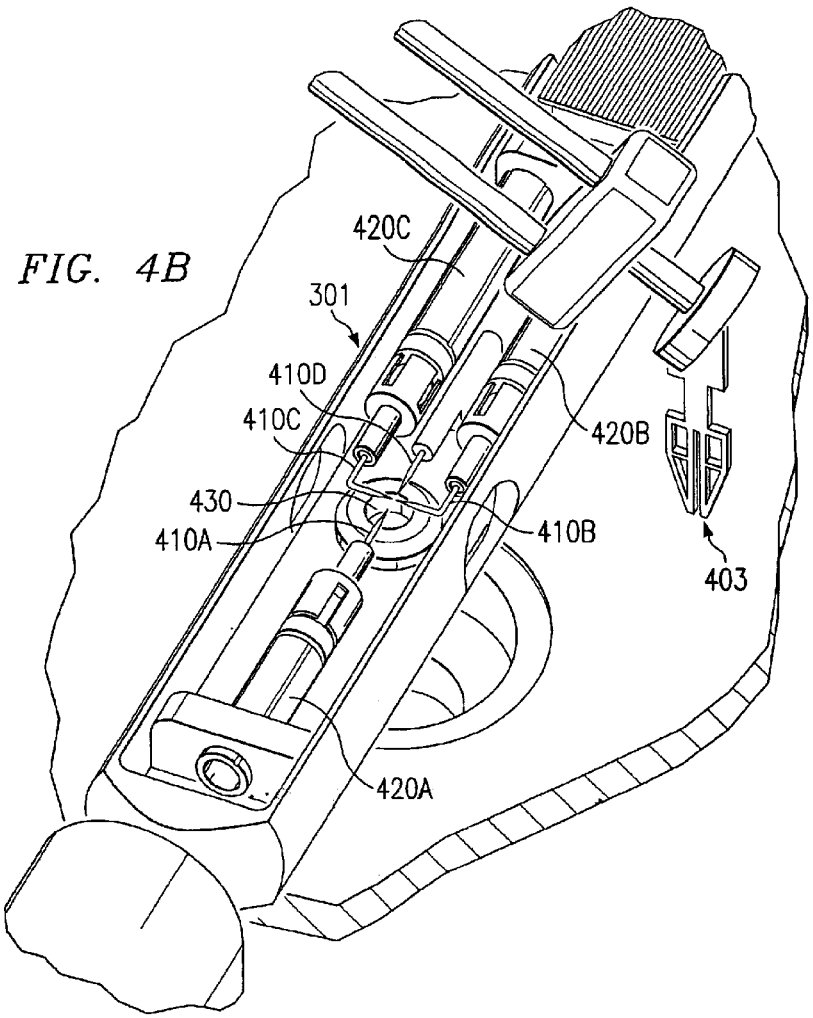

The first portion 301 cornprises a stage for receiving a sample (or "specimen") to be studied, such as stage 430 shown more clearly in FIG. 4B. Preferably, the first portion 301 also comprises at least one manipulation mechanism that is controllably operable for manipulating a sample arranged on the stage. Most preferably, the first portion 301 comprises a plurality of manipulation mechanisms. For instance, an example configuration in which four manipulation mechanisms are included is shown more clearly in FIG. 4B (having manipulation mechanisms 410A, 410B, 410C, and 410D).

In the example configuration of FIGS. 3A–3B, the second portion 302 is removably coupled to the first portion 301. For instance, the first and second poitions are shown as coupled together in FIG. 3A, and they are shown as uncoupled in FIG. 3B. In a preferred embodiment, first and second portions 301 and 302 provide an adaptable interface for sample holder 300 to enable such sample holder to be coupled to any of a plurality of different types of microscopes. For instance, portion 302 may preferably be removably coupled securely to portion 301 via coupling means 303 (which may be referred to herein as "adapting" means, as it allows the interface of sample holder 300 to be adapted to comply with various different microscope interfaces). For example, portion 302 may screw onto the end of portion 301, as shown in the example of FIG. 3B. Of course, various other types of mechanical coupling mechanisms may be utilized in alternative embodiments. In addition to providing a mechanical coupling (e.g., screw threads), coupling means 303 may also provide an electrical coupling. For instance, coupling means 303 may include a multi-pin electrical connector that allows portion 301 to be communicatively coupled (e.g., electrically coupled) to a control system for controlling the operation of the manipulator mechanisms included in portion 301 (as described further below), or such multi-pin electrical connector may provide an electrical coupling to portion 302 which may in turn be communicatively coupled to such a control system for controlling the operation of the manipulator mechanisms of portion 301.

In the example of FIGS. 3A–3B, first portion 301 has a first length and when second portion 302 is coupled with portion 301, sample holder 300 has a second length. Thus, in this example, the length of sample holder 300 may be adjusted (e.g., by coupling or uncoupling portions 301 and 302) to enable sample holder 300 to adaptively comply with any of various different microscope interfaces. For instance, commercially available TEMs have a sample chamber that requires a long sample holder than may be used with SEM sample chambers. Thus, as described in greater detail hereafter, in certain embodiments, portions 301 and 302 may be coupled together to enable sample holder 300 to interface with a TEM's sample chamber, and portion 301 may be uncoupled from portion 302 and such portion 301 may then interface with an SEM–s sample chamber. Accordingly, in this example configuration, once uncoupled from portion 302, portion 301 becomes a fully functional and independent unit. Accordingly, in this example embodiment, portion 301 provides a first interface for coupling with a first type of microscope (e.g., an SEM microscope with a sample chamber having an interface for receiving a sample holder of a first length), and second portion 302 may be coupled to portion 301 to provide a second interface for coupling with a second type of microscope (e.g., a TEM microscope with a sample chamber having an interface for receiving a sample holder of a second length).

In this example configuration, the length $1_1$ of first portion 301 is approximately 10 cm, and the length $1_2$ of portion 302 is approximately 24 cm. Thus, the overall length $L_1$ of sample holder 300 (when portions 301 and 302 are coupled) is approximately 34 cm. Further, the diameter of sample holder 300 is preferably suitable for interfacing with the well-defined dimensions of sample commercially available TEM sample chambers. As described further below, in this configuration portion 301 comprises a suitable length $1_1$ for interfacing with an SEM's sample chamber, and when coupled together, portions 301 and 302 provide a suitable length $L_1$ for interfacing with a TEM's sample chamber. Of course, in alternative embodiments, the various lengths and dimensions of sample holder 300 (and its respective portions 301 and 302) may differ from the example configuration described above to, for example, enable such sample holder 300 to interface with one or more desired types of microscopes, and any such alternative embodiment is intended to be within the scope of the present invention.

Thus, sample holder 300 preferably comprises an adaptable interface. While the example configuration of FIGS. 3A–3B provides an adjustable interface that is adjusted by coupling or uncoupling portions of sample holder 300, various other techniques may be employed in alternative embodiments for providing an adjustable interface in alternative embodiments. For example, sample holder 300 may comprise a portion (e.g., portion 302) that is controllably expandible and contractable (in one or more dimensions, such as width (or diameter) and length) so as to adjust (or conform) to any of a plurality of different microscope interfaces.

In operation of at least one embodiment, a user may place a sample on the stage 430 (see FIG. 4B) of sample holder 300, and may then couple sample holder 300 to one of a plurality of different types of microscopes. Thereafter, the manipulation mechanism(s) of sample holder 300 may be used to manipulate the sample as such sample is being imaged by the microscope. As shown in the example of FIGS. 4A–4B, sample holder 300 may, in certain instances, be coupled to a light microscope 400, and an external manipulation mechanism (i.e., external to sample holder 300), such as manipulation mechanism 402, may be utilized to initially arrange the manipulation mechanisms of sample holder 300. For example, as shown in FIG. 4A, sample holder 300 may be coupled to a platform 401 that comprises external manipulation mechanism 402 coupled therewith. As can be seen in greater detail in FIG. 4B, external manipulation mechanism 402 may comprise an end-effector 403, such as a gripper, that may be controlled to engage and arrange the internal manipulation mechanism(s) of sample holder 300.

For instance, in the example of FIG. 4B sample holder 300 comprises four manipulation mechanisms 410A, 410B, 410C, and 410D (referred to collectively herein as manipulation mechanisms 410). External manipulation mechanism 402 may use end-effector 403 to perform relatively coarse adjustment of internal manipulation mechanisms 410. For instance, a sample may be arranged on stage 430 of sample holder 300, and while viewing the manipulation mechanisms 410 through light microscope 400, a user may control external manipulation mechanism 402 to cause end-effector 403 to engage one or more of the internal manipulation mechanisms 410 and perform relatively coarse adjustment of the positioning of such manipulation mechanisms 410 relative to the sample. Each of manipulation mechanisms 410 may comprise an end-effector, such as a probe, gripper, etc., and adjustment mechanism 402 maybe used to adjust such end-effector to an initial position relative to the sample. While adjustment mechanism 402 may provide a relatively large travel range to a manipulation mechanism 410 in one or more dimensions (preferably in three dimensions), it may not be as precise in its positioning of such manipulation mechanism 410 as the below-described internal actuators of sample holder 300. For instance, adjustment mechanism 402 may be capable of providing a relatively large range of movement to a manipulation mechanism 410 (e.g., several millimeters) with resolution of approximately 30 nanometers. Thus, such adjustment mechanism 402 may be used to initially position the end-effectors of manipulator mechanisms 410 to within approximately 30 nanometers of a desired position.

In a preferred embodiment one or more of the internal manipulation mechanisms 410 comprise an actuation mechanism for performing more fine/precise positioning of such internal manipulation mechanisms 410 end-effectors. For instance, in the example configuration of FIG. 4B, manipulation mechanisms 410A, 410B, and 410C are coupled to piezoelectric tubes 420A, 420B, and 420C, respectively, such that piezoelectric tubes 420A, 420B, and 420C can impart movement to their respective manipulation mechanism for precise positioning thereof. Thus, in the example configuration of FIG. 4B, manipulation mechanisms 410A, 410B, and 410C are controllably moveable (using piezoelectric tubes 420A, 420B, and 420C), and manipulation mechanism 410D is stationary. Of course, in alternative embodiments, manipulation mechanism 410D may also be coupled to an actuation mechanism such that it is also moveable.

Piezoelectric tubes 420A, 420B, and 420C preferably comprise quadruple electroded piezoelectric tubes that provide precise movement of a manipulation mechanism (e.g., its end-effector) in free space in the range of a few microns with nanometer resolution (or better, e.g., sub-nanometer resolution). Alternatively, such well-known actuators as a piezostack, a piezo bimorph, or a simple piezo plate, as examples, may be used if such fine translation of the manipulation mechanism is needed in only one dimension. Further, a stick-slip type piezoelectric rotational actuator may be implemented for one or more of the manipulation mechanisms, and such piezoelectric rotational actuator may preferably be operated in continuous 360 degree rotation with an angular step resolution of less than 0.02 degree. Such above-mentioned piezoelectric tubes 420A, 420B, and 420C are well-known in the art and therefore are not described in greater detail herein. It should be understood that while piezoelectric tubes are shown in the example configuration of FIG. 4B, in alternative configurations, any other suitable actuation mechanism may be utilized, including without limitation thermal microactuators, electrostatic microactuators, stick-slip piezoelectric micro actuators, piezo bimorph microactuators, comb drive microelectromechanical system (MEMS) actuators, and memory alloy microactuators Of course, size constraints for suitably interfacing with a particular type of microscope (e.g., a TEM) in certain embodiments may limit the types of actuation mechanisms that are suitable for implementation within sample holder 300 (e.g., may limit the suitable actuation mechanisms to micro-scale actuation mechanisms).

It should be recognized that by including high-precision actuators for the manipulator mechanisms 410 within sample holder 300, and not including long-range, coarse actuators within such sample holder 300, a plurality of manipulator mechanisms 410 may be included within the sample holder 300. That is, by using an adjustment mechanism 402 that is external (or independent from) sample holder 300 for performing the coarse adjustment of manipulator mechanisms 410 to initially position such manipulator mechanisms, a plurality of manipulator mechanisms 410 may be implemented with high-precision actuators for controlling such manipulator mechanisms 410 within sample holder 300. Thus, a plurality of manipulator mechanisms 410 that comprise high-precision actuators that are independently operable for controlling the movement of their respective manipulator mechanism may be implemented within even a relatively small sample holder, such as a sample holder that is sufficiently small for interfacing with a sample chamber of commercially available TEMs.

As described briefly above, detachable sample holders that include a manipulator mechanism have been developed in the existing art that are capable of being removably coupled to a TEM. Such detachable sample holders have been limited to including only one manipulator mechanism (e.g., end-effector) therein. Further, because such detachable sample holders of the existing art have included both a coarse adjustment mechanism and a high-precision adjustment mechanism, each for imparting movement to the manipulator mechanism's end-effector, only one manipulator mechanism has been recognized in such configurations. That is, because of the relatively limited size of the sample chamber of commercially available TEMs in which the sample holder is inserted, such detachable sample holders of the existing art have comprised only one manipulator mechanism that is operable for manipulating a sample. It is often desirable to have a plurality of manipulator mechanisms in order to perform a desired type of manipulation on a sample under study. By not including an actuator for providing coarse adjustment of the manipulator mechanisms within sample holder 300, a plurality of manipulator mechanisms may be implemented within even a relatively small sample holder 300, such as a sample holder that is sufficiently small for interfacing with a sample chamber of commercially available TEMs.

In certain embodiments, sample holder 300 comprises an adjustable interface that enables sample holder 300 to conform to any of a plurality of different microscope interfaces. In certain embodiments, sample holder 300 is capable of detachably coupling with at least one type of microscope (e.g., a TEM and/or SEM) and comprises a plurality of manipulator mechanisms integrated therein that are controllably operable for manipulating a sample under study with such microscope. In a preferred embodiment, sample holder 300 comprises both an adjustable interface such that it is capable of selectively coupling with any of a plurality of different microscope interfaces (e.g., either a TEM or an SEM interface) and a plurality of manipulator mechanisms integrated therein that are controllably operable for manipulating a sample under study with such microscope. Of course, in certain embodiments, sample holder 300 may be implemented to comprise an adjustable interface without necessarily comprising a plurality of manipulator mechanisms, and in certain embodiments, sample holder 300 may comprise a plurality of manipulator mechanisms integrated therein without necessarily comprising an adjustable microscope interface.

Figure 5:
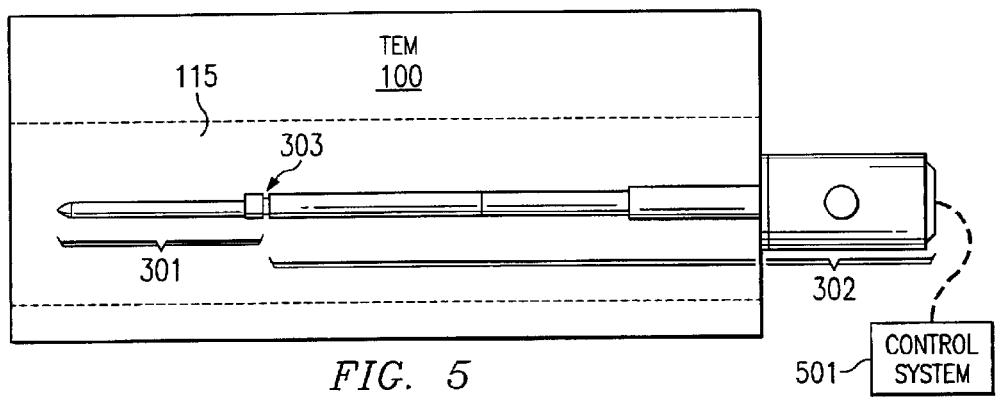
FIG. 5 shows a manipulation system of a preferred embodiment of the present invention coupled with a TEM.

Thus, in certain embodiments, sample holder 300 comprises an adjustable interface that enables sample holder 300 to conform to any of a plurality of different microscope interfaces. As described above with FIGS. 1–2, TEMs and SEMs generally comprise a sample chamber having an interface for receiving a sample holder, and the sample chamber interface for TEMs and SEMs is generally different. FIG. 5 shows a preferred embodiment of the present invention coupled with a TEM 100. As shown, portion 301 comprising a sample stage 430 and at least one manipulation mechanism 410 is inserted into sample chamber 115 of TEM 100. In this example, sample holder 300 has portion 302 coupled thereto such that it complies with sample chamber 115 (e.g., has the appropriate length for presenting a sample on sample stage 430 to be imaged by TEM 100). Accordingly, once inserted into sample chamber 115, TEM 100 may be used to image a sample arranged on sample stage 430 and/or manipulation mechanism(s) 410 may be controlled to manipulate such sample.

As further shown in this example of FIG. 5, sample holder 300 may be communicatively coupled to a control system 501. Control system 501 is preferably a processor-based device, such as a personal computer, that is operable to generate control signals to be communicated to actuators 420A, 420B, and 420C in order to control their operation to impart desired movement to manipulator mechanism(s). Such control signals may, for example, be generated by control system 501 in response to user input thereto (e.g., user-input instructions requesting a particular operation of manipulator mechanism(s) 410). For instance, as shown in the example configuration of FIG. 5, one end of portion 302 of sample holder 300 may be mechanically and electrically connected to portion 301, and the opposing end of portion 302 may be communicatively (e.g., electrically) coupled to control system 501. For example, a multi-pin electrical connector may be used to electrically couple control system 501 to portion 302 in order to communicate control signals thereto for controlling the operation of manipulator mechanisms 410 of sample holder 300.

Figure 6:
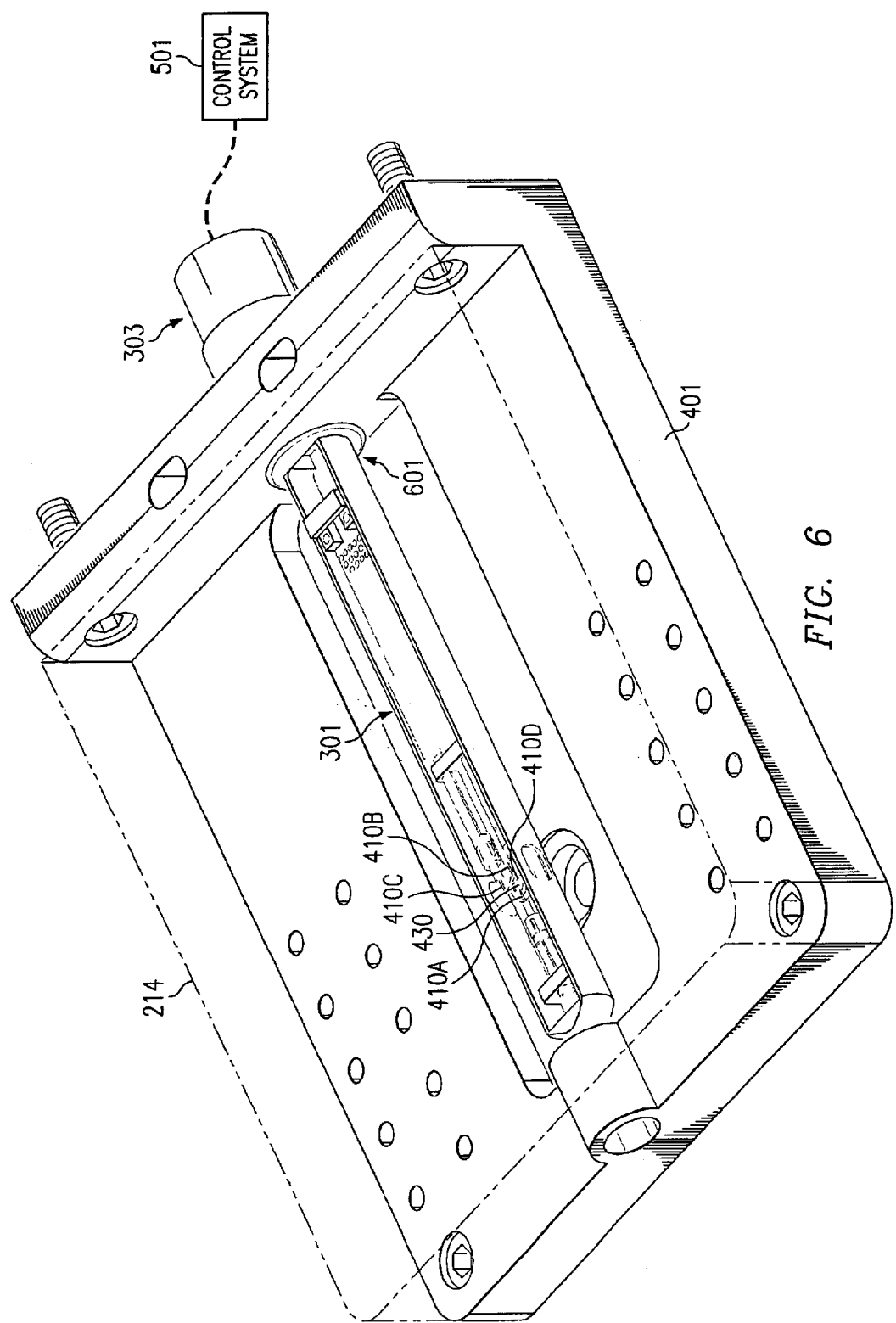
FIG. 6 shows a manipulation system of a preferred embodiment of the present invention coupled with an SEM.

FIG. 6 shows a preferred embodiment coupled with an SEM. As shown, portion 301 comprising a sample stage 430 and at least one manipulation mechanism 410 is inserted into sample chamber 214 of the SEM. In this example, sample holder 300 has portion 302 uncoupled therefrom such that it complies with sample chamber 214 (e.g., is of appropriate length to enable sample holder 300 to be presented to such sample chamber in an appropriate manner for imaging a sample arranged on sample stage 430). Accordingly, once inserted into sample chamber 214, the SEM may be used to image a sample arranged on sample stage 430 and/or manipulation mechanism(s) 410 may be controlled to manipulate such sample.

As further shown in the example of FIG. 6, sample holder 300 may be coupled to a platform 401, and such platform 401 having sample holder 300 coupled thereto may be presented to sample chamber 214 of an SEM. That is, platform 401 may aid sample holder 300 in properly interfacing with the sample chamber 214 of an SEM. It should be recognized that sample holder 300 may also be coupled to such a platform 401, as shown in FIG. 4A, and an external adjustment mechanism 402 may be coupled to such platform 401 and used to initially adjust the sample holder's manipulator mechanisms 410. In certain embodiments, such an external adjustment mechanism 402 may be detachably coupled to platform 401 such that it can be removed from the platform 401 and such platform 401 maybe inserted into an SEM's sample chamber. Such platform 401 may be of a size similar to that of traditional SEM sample holder's, and it may therefore aid in properly aligning sample holder 300 within an SEM's sample chamber 214 properly for imaging a sample on sample stage 430 with such SEM. Of course, in certain embodiments, such platform 401 may be maintained in an SEM's sample chamber and sample holder 300 may be coupled therewith via the platform's interface 601 to image and/or manipulate a sample, and sample holder 300 may be uncoupled from such platform's interface 601 in order to remove the sample holder 300 from the SEM's sample chamber 214 (as opposed to inserting and removing the platform 401 from the SEM's sample chamber 214 each time that a sample is presented and removed from the SEM). Also, in certain implementations, sample holder 300 may be presented directly to an SEM's sample chamber 214 without using such a platform 401, and any such implementation is intended to be within the scope of the present invention.

As further shown in this example of FIG. 6, sample holder 300 may be communicatively coupled to a control system 501. Such control system 501 is briefly described above. For instance, as shown in the example configuration of FIG. 6, one end of portion 301 of sample holder 300 may be communicatively (e.g., electrically) coupled to control system 501. Thus, when portion 302 is uncoupled from portion 301, portion 301 itself may comprise a suitable interface for communicatively coupling with control system 501. For example, a multi-pin electrical connector may be used to electrically couple control system 501 to portion 301 in order to communicate control signals thereto for controlling the operation of manipulator mechanisms 410 of sample holder 300.

Thus, in certain embodiments of the present invention, a sample holder 300 is provided that comprises at least one manipulation mechanism and an adjustable interface to enable such sample holder 300 to be selectively coupled to any of a plurality of different types of microscopes. That is, in certain embodiments, sample holder 300 comprises at least one manipulation mechanism for manipulating a sample and an interface that that is adaptable to conform to a plurality of different types of microscope interfaces. More specifically, in at least one embodiment, sample holder 300 may be selectively coupled to either a TEM or an SEM.

Preferably, sample holder 300 can be detachably coupled to a microscope in a manner that does not interfere with normal operation (e.g., imaging functionality) of such microscope. Rather, sample holder 300 may be used solely for imaging a sample, if so desired, without using the manipulation mechanism(s) 410 for manipulating such sample. Alternatively, a traditional sample holder may be interchangeably used when only imaging of a sample is desired. That is, sample holder 300 is preferably implemented such that it can be used interchangeably with traditional sample holders of a microscope, as such sample holder 300 is preferably not required to be integrated with a microscope or require other modifications to a microscope that interfere with the microscope's normal functionality. Thus, certain embodiments provide a portable sample holder 300 that comprises integrated manipulation mechanism(s) 410, wherein such sample holder 300 may be removably coupled to a microscope to provide manipulation capabilities (such as those described further herein below) when so desired.

Figure 7:
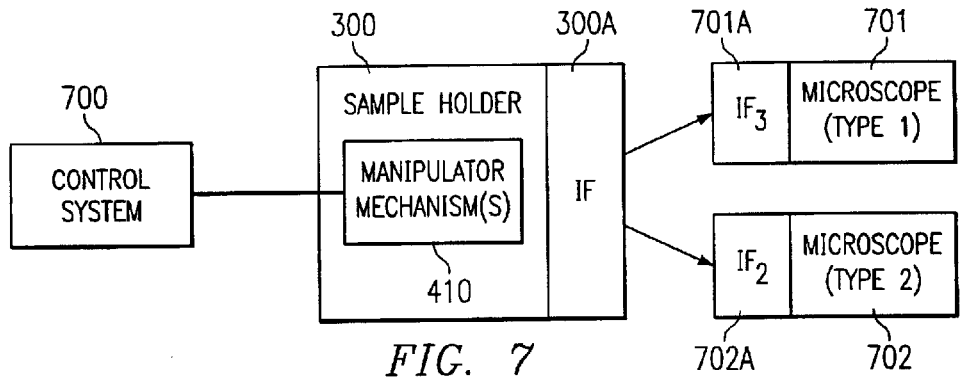
FIG. 7 shows an example block diagram of a preferred embodiment of the present invention.

Thus, FIG. 7 shows an example block diagram of at least one embodiment of the present invention, wherein sample holder 300 comprises manipulator mechanism(s) 410 and interface 300A for interfacing with a microscope. Preferably, control system 501, such as is briefly described above, is communicatively coupled to manipulator mechanism(s) 410. For example, control system 501 may be utilized to control the operation of actuation mechanisms 420A, 420B, and 420C to precisely position manipulator mechanism(s) (or "end-effeetors") 410. That is, such control system 501 may be used to control the manipulator mechanism(s) 410 in order to manipulate a sample under study. For instance, sample holder 300 may be coupled to a microscope, such as microscope 701 or microscope 702 of FIG. 7, and control system 501 may be utilized to control actuators 420A, 420B, and 420C to precisely move one or more of manipulator mechanism(s) (or "end-effectors") 410 in order to manipulate a sample being imaged by such microscope.

As described above, interface 300A of sample holder 300 is preferably adaptable to enable sample holder 300 to conform to a plurality of different microscope interfaces. For example, interface 300A may be adapted to conform with an interface 701A of a first type of microscope 701, such that sample holder 300 may be coupled to such microscope 701 to enable imaging and/or manipulation of a sample arranged in such sample holder 300. Further, interface 300A may be adapted to coiiform with a different interface 702A of a second type of microscope 702, such that sample holder 300 may be coupled to such microscope 702 to enable imaging and/or manipulation of a sample arranged in such sample holder 300. As described with FIGS. 5–6 above, for example, microscope 701 may, in certain embodiments, comprise a TEM and microscope 702 may comprise an SEM, and adaptable interface 300A may enable sample holder 300 to be selectively coupled to either of such microscopes 701 and 702.

Figure 8:
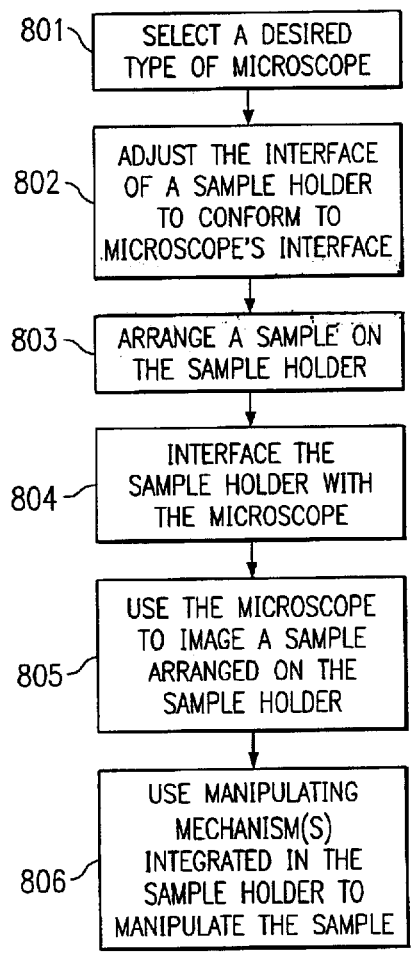
FIG. 8 shows an operational flow diagram that illustrates an example of how certain embodiments of the present invention may be utilized.

Turning now to FIG. 8, an operational flow diagram is shown that illustrates an example of how certain embodiments of the present invention may be utilized. More specifically, FIG. 8 shows an example operational flow diagram for using a microscope to study a sample in accordance with certain embodiments of the present invention. As shown, in operational block 801 a user selects a desired type of microscope. That is, operational block 801 comprises a user selecting a desired type of a plurality of different types of microscopes. Each of such plurality of different types of microscopes may have a different type of interface for receiving a sample holder. In operational block 802, the user adjusts the interface of a sample holder to conform to the microscope's interface. That is, operational block 802 comprises a user adjusting an interface of a sample holder to conform to the interface of the desired type of microscope. As described above, the sample holder's interface is preferably adjustable to conform to any of a plurality of different types of microscope interfaces for receiving a sample holder.

In operational block 803, a user arranges a sample on the sample holder. Thereafter, in operational block 804, the sample holder is interfaced with the desired type of microscope such that the sample can be imaged by such desired type of microscope. Accordingly, in operational block 805, the desired type of microscope may be used to image the sample arranged on the sample holder. Further, in operational block 806, manipulating mechanisms integrated within the sample holder (e.g., manipulating mechanisms 410 of sample holder 300) may be used to manipulate the sample.

Figure 9:
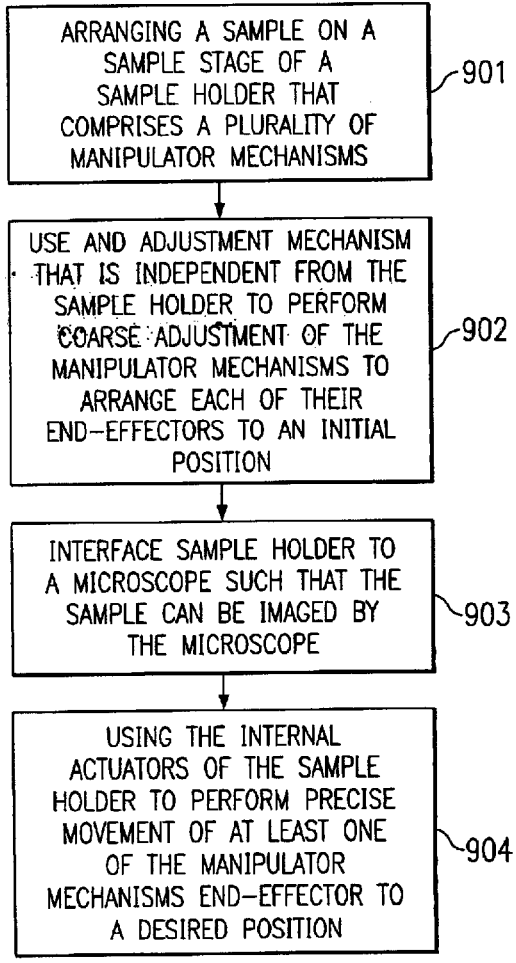
FIG. 9 shows an operational flow diagram that illustrates an example of how certain embodiments of the present invention may be utilized.

In certain embodiments of the present invention, sample holder 300 is capable of being detachably coupled to a microscope and comprises a plurality of manipulator mechanisms. Turning to FIG. 9, an operational flow diagram is shown that illustrates an example of how certain embodiments of the present invention may be utilized. In operational block 901, a sample is arranged on a sample stage 430 of sample holder 300, which comprises a plurality of manipulator mechanisms 410. In operational block 902, an adjustment mechanism (e.g., adjustment mechanism 402 of FIG. 4A) that is independent from sample holder 300 is used to perform coarse adjustment of the manipulator mechanisms 410 in order to arrange each of their end-effectors to an initial position. In operational block 903, sample holder 300 is interfaced to a microscope such that the sample arranged on sample stage 430 can be imaged by the microscope. In certain embodiments, the interface of sample holder 300 may be adjustable to enable it to conform to any of a plurality of different microscope interfaces (e.g., to a TEM's sample chamber and an SEM's sample chamber), and in other embodiments, the interfaced of sample holder 300 may not be so adjustable (e.g., it may be fixed). Thereafter, in operational block 904, the internal actuators (e.g., actuators 420A, 420B, and 420C) of sample holder 300 are utilized (e.g., via control system 501) to perform precise movement of at least one of the manipulator mechanisms' end-effectors to a desired position.

As described above, in certain embodiments of the present invention, sample holder 300 comprises an adaptable interface that enables such sample holder 300 to be coupled to any of a plurality of different types of microscope interfaces. However, in certain other embodiments, sample holder 300 may not comprise such an adaptable interface. In certain embodiments of the present invention, sample holder 300 is capable of being detachably coupled to a microscope and comprises a plurality of manipulator mechanisms. Preferably, each of such manipulator mechanisms is independently moveable by a corresponding actuator included within the sample holder 300. In a preferred embodiment, such as in the example configuration of sample holder 300 described above in conjunction with FIGS. 3A–3B and 4A–4B, such sample holder 300 comprises both an adjustable interface such that it is capable of selectively coupling with any of a plurality of different microscope interfaces (e.g., either a TEM or an SEM interface) and a plurality of manipulator mechanisms integrated therein that are controllably operable for manipulating a sample under study with such microscope.

While manipulation mechanisms 410 are shown herein (e.g., in FIG. 4B) as probes in this example configuration of sample holder 300, it should be understood that various other types of manipulation mechanisms may be implemented instead of or in addition to probes. For example, such manipulation mechanisms (or "end-effectors") as grippers, glass fibers, hypodermic needles, hoses, and nanometer-scale hooks, may be implemented in place of one or more of the manipulation mechanisms 410 of sample holder 300 to enable various different types of manipulation operations to be performed on a sample under study. Further, in certain embodiments, such manipulation mechanisms 410 may be interchangeable. For example, a probe may be interchangeable within sample holder 300 with a gripper (or other type of manipulation mechanism) to enable a user to selectively configure sample holder 300 with the desired types of manipulation mechanisms for performing a desired manipulation operation on a sample under study. For instance, a universal adapter may be coupled to each of piezoelectric tubes 420A–420C, and any manipulation mechanism complying with the interface to such universal adapter may be interchangeably used within sample holder 300.

As described above, sample holder 300 preferably comprises a plurality of manipulation mechanisms implemented therein. Most preferably, at least four manipulation mechanisms are implemented within such sample holder 300. Having a plurality of manipulation mechanisms enables various types of measurements to be acquired for a sample under study. Certain embodiments of the present invention enable measurements that have traditionally been unavailable because of an insufficient number of manipulation mechanisms being implemented for a microscope's manipulation system.

For example, with conductive and sharp probes, such as etched conductive W, Pt, Au probes, implemented as an end-effector, conductivity measurement can be performed on a nanometer-scale section of a sample either placed on the surface of sample stage 430 or suspended in free space by positioning two probes on the surface of the sample (i.e., using two probes to hold the sample in free space and one or more other probes to acquire measurements of sample). With 4 manipulator modules included within sample holder 300, a four-probe kelvin conductivity measurement can be conducted down to the nanometer-scale on samples under study. One advantage of a four-probe conductivity measurement is that the contact resistance effect intrinsic to the formed interface between the probe and the sample can be neutralized, and the exact conductance of the sample can be obtained, which is not possible for two or three probe conductivity measurement. With use of other types of end-effectors, such as force probes, force measurement or combined force/electrical measurement can also be realized down to the nanometer-scale. As those of skill in the art will appreciate, embodiments of the present invention enable various other types of measurements and/or characterizations to be acquired for a sample.

Further, the manipulation system of certain embodiments of the present invention may be utilized to perform assembly operations on micro- and/or nano-scale objects. For example, a plurality of samples may be arranged on stage 430, and manipulation mechanisms 410 may, in certain applications, be used to assemble such samples into a desired structure. Additionally, various other applications of such a manipulation system will be recognized by those of ordinary skill in the art.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A manipulation system comprising:
    a sample holder having an interface that is adjustable to comply with a plurality of different microscope interfaces; and
    at least one manipulation mechanism operable to manipulate a sample.

2. The manipulation system of claim 1 wherein said at least one manipulation mechanism comprises an end-effector and an actuator controllably operable to impart movement to said end-effector.

3. The manipulation system of claim 2 wherein said end-effector comprises at least one selected from the group consisting of: probe, gripper, glass fiber, hypodermic needle, hook, and hose.

4. The manipulation system of claim 2 wherein said actuator comprises a piezoelectric tube.

5. The manipulation system of claim 2 wherein said actuator is controllably operable to impart said movement with at least nanometer-scale precision.

6. The manipulation system of claim 1 wherein said at least one manipulation mechanism comprises a plurality of manipulation mechanisms.

7. The manipulation system of claim 6 wherein multiple ones of said plurality of manipulation mechanisms each comprise an end-effector and an actuator controllably operable to impart movement to its manipulation mechanism's respective end-effector.

8. The manipulation system of claim 7 wherein said actuator of each of said multiple ones of manipulation mechanisms comprises a piezoelectric tube.

9. The manipulation system of claim 7 wherein said actuator is controllably operable to impart said movement with at least nanometer-scale precision.

10. The manipulation system of claim 7 wherein said plurality of different microscope interfaces comprises a transmission electron microscope (TEM) interface.

11. The manipulation system of claim 1 wherein said plurality of different microscope interfaces comprises a scanning electron microscope (SEM) interface and a transmission electron microscope (TEM) interface.

12. The manipulation system of claim 1 wherein said sample holder comprises a stage for receiving the sample and wherein said interface is adaptable to interface with any one of said plurality of different microscope interfaces in a manner that enables the sample to be imaged using the microscope with which the manipulation system is interfaced.

13. The manipulation system of claim 1 wherein said interface is adaptable to interface with any one of said plurality of different microscope interfaces in a manner that does not interfere with other operable components of the microscope with which the sample holder is interfaced.

14. The manipulation system of claim 1 wherein said sample holder comprises said at least one manipulation mechanism and wherein said interface enables said manipulation system to be detachably coupled to any of said plurality of different microscope interfaces.

15. The manipulation system of claim 14 wherein said plurality of different microscope interfaces comprises a plurality of different microscope sample chambers.

16. The manipulation system of claim 1 wherein said plurality of different microscope interfaces comprise interfaces for receiving a sample to be imaged.

17. A method of using a microscope to study a sample, said method comprising:
    selecting a desired type of a plurality of different types of microscopes, each of said plurality of different types of microscopes having a different type of interface for receiving a sample holder;
    adjusting an interface of a sample holder to conform to the interface of the desired type of microscope, wherein said sample holder's interface is adjustable to conform to any of said different types of microscope interfaces for receiving a sample holder;
    arranging a sample on said sample holder; and
    interfacing said sample holder with said desired type of microscope such that said sample can be imaged by said desired type of microscope.

18. The method of claim 17 wherein said sample holder comprises at least one manipulation mechanism.

19. The method of claim 18 wherein said at least one manipulation mechanism comprises an end-effector and an actuator for imparting movement to said end-effector.

20. The method of claim 18 further comprising:
    manipulating said sample using said at least one manipulation mechanism.

21. The method of claim 18 wherein said sample holder comprises a plurality of manipulation mechanisms.

22. The method of claim 21 wherein multiple ones of said plurality of manipulation mechanisms each comprise an end-effector and an actuator for imparting movement to said end-effector.

23. The method of claim 21 further comprising:
    manipulating said sample using said at least one manipulation mechanism.

24. The method of claim 17 further comprising:
    imaging said sample using said desired type of microscope.

25. The method of claim 17 wherein said plurality of different types of microscopes comprise at least a transmission electron microscope (TEM) and a scanning electron microscope (SEM).

26. A portable sample holder for holding a sample for presentation to a microscope, said portable sample holder comprising:
    a stage for receiving a sample;
    a plurality of manipulation mechanisms for manipulating the received sample, wherein multiple ones of said plurality of manipulation mechanisms each comprise an end effector and an actuator for imparting movement to said end-effector; and
    an interface for detachably coupling with a microscope.

27. The portable sample holder of claim 26 wherein said end-effector comprises at least one selected from the group consisting of: probe, gripper, glass fiber, hypodermic needle, hook, and hose.

28. The portable sample holder of claim 26 wherein said actuator comprises a piezoelectric tube.

29. The portable sample holder of claim 26 comprising: at least four of said manipulation mechanisms.

30. The portable sample holder of claim 26 wherein said interface is adaptable to conform to a plurality of different types of microscope interfaces.

31. The portable sample holder of claim 30 wherein said interface is adaptable to conform at least to a transmission electron microscope (TEM) interface and a scanning electron microscope (SEM) interface.

32. The portable sample holder of claim 30 comprising: at least two portions that are detachably coupled to each other, wherein when said at least two portions are coupled to each other said portable sample holder complies with a first type of microscope interface and wherein when said at least two portions are detached one of said at least two portions of said portable sample holder complies with a second type of microscope interface.

33. The portable sample holder of claim 32 wherein said first type of microscope interface comprises a transmission electron microscope (TEM) interface and wherein said second type of microscope interface comprises a scanning electron microscope (SEM) interface.

34. A system comprising:
sample holder that includes a sample stage for receiving a sample, an interface for coupling the sample holder with a microscope such that a sample received on said sample stage can be imaged by said microscope, and a plurality of manipulator mechanisms controllably operable to manipulate said received sample, wherein multiple ones of said plurality of manipulator mechanisms comprise an end-effector and an actuator operable to impart precise movement to its respective end-effector.

35. The system of claim 34 wherein said plurality of manipulator mechanisms are controllably operable to manipulate said received sample while said received sample is being imaged by a microscope to which said sample holder is interfaced.

36. The system of claim 34 said end-effector comprises at least one selected from the group consisting of: probe, gripper, glass fiber, hypodermic needle, hook, and hose.

37. The system of claim 34 wherein said actuator operable to impart precise movement comprises a piezoelectric tube.

38. The system of claim 34 wherein said actuator operable to impart precise movement is operable to impart said movement with at least nanometer-scale precision.

39. The system of claim 34 wherein said actuator is operable to impart said precise movement in three dimensions.

40. The system of claim 34 wherein said microscope comprises, a transmission electron microscope (TEM).

41. The system of claim 34 wherein said interface for coupling the sample holder with a microscope comprises an adjustable interface that is adjustable to comply with a plurality of different microscope interfaces.

42. The system of claim 41 wherein said interface is adjustable to comply at least with a transmission electron microscope (TEM) interface and a scanning electron microscope (SEM) interface.

43. The system of claim 34 further comprising:
an adjustment mechanism external to said sample holder that is controllably operable to engage one or more of said plurality of manipulator mechanisms and coarsely adjust said one or more of said plurality of manipulator mechanisms.

44. The system of claim 43 wherein said adjustment mechanism is operable to perform said coarse adjustment of said one or more manipulator mechanisms while said one or more manipulator mechanisms are being imaged by a light microscope.

45. The system of claim 43 wherein said sample holder comprises an interface for coupling to a platform that comprises said adjustment mechanism.

46. The system of claim 45 wherein said platform is arranged relative to a light microscope such that when said sample holder is interfaced with said platform said one or more manipulator mechanisms can be imaged by said light microscope.

47. The system of claim 43 wherein said adjustment mechanism is operable to coarsely adjust said one or more of said plurality of manipulator mechanisms with precision of approximately 30 nanometers.

48. The system of claim 43 wherein said adjustment mechanism is operable to provide at least two millimeters range of movement.

49. A system comprising:
sample holder that includes a sample stage for receiving a sample, an interface for coupling the sample holder with a microscope such that a sample received on said sample stage can be imaged by said microscope, and a plurality of manipulator means for manipulating said received sample, wherein each of said plurality of manipulator means comprises an end-effector and wherein multiple ones of said plurality of manipulator means each comprises an actuator means for imparting precise movement to its respective end-effector from an initial position to a desired position; and
an adjustment means that is independent from said sample holder, said adjustment means for coarsely adjusting at least one of said plurality of manipulator mechanisms to position said at least one manipulator mechanism's end-effector to said initial position.

50. The system of claim 49 wherein said plurality of manipulator means are controllably operable to manipulate said received sample while said received sample is being imaged by a microscope to which said sample holder is interfaced.

51. The system of claim 49 wherein said actuator means comprises a piezoelectric tube.

52. The system of claim 49 wherein said actuator means for imparting precise movement is operable to impart said movement with at least nanometer-scale precision.

53. The system of claim 49 wherein said actuator means is operable to impart said precise movement in three dimensions.

54. The system of claim 49 wherein said microscope comprises a transmission electron microscope (TEM).

55. The system of claim 49 wherein said interface for coupling the sample holder with a microscope comprises an adjustable interface that is adjustable to comply with a plurality of different microscope interfaces.

56. The system of claim 55 wherein said interface is adjustable to comply at least with a transmission electron microscope (TEM) interface and a scanning electron microscope (SEM) interface.

57. A method for manipulating a sample under study with a microscope, said method comprising:
arranging a sample on a sample stage of a sample holder that further comprises a plurality of manipulator mechanisms, wherein each of said manipulator mechanisms comprises an end-effector and wherein multiple ones of said plurality of manipulator mechanisms each comprises an actuator that is operable to impart precise movement to its respective end-effector;

using an adjustment mechanism that is independent from said sample holder to perform coarse adjustment of at least one of said plurality of manipulator mechanisms to arrange said at least one manipulator mechanism's end-effector to an initial position;

interfacing said sample holder to a microscope such that said sample can be imaged by said microscope; and using said actuator of at least a first one of said multiple ones of manipulator mechanisms to perform precise movement of said at least a first one manipulator mechanism's end-effector to a desired position.

58. The method of claim 57 further comprising:

coupling said sample holder to a platform that comprises said adjustment mechanism.

59. The method of claim 57 wherein said adjustment mechanism is arranged relative to a light microscope such that when using said adjustment mechanism to perform said coarse adjustment said at least one manipulator mechanism's end-effector can be imaged by said light microscope.

60. The method of claim 57 further comprising:

using said adjustment mechanism while said at least one manipulator mechanism's end-effector is being imaged by a microscope.

61. The method of claim 57 wherein said actuator comprises a piezoelectric tube.

62. The method of claim 57 further comprising:

adapting an interface of said sample holder to comply with an interface to said microscope.

63. The method of claim 57 wherein said precise movement comprises movement with at least nanometer-scale precision.

64. The method of claim 57 wherein said desired position comprises a position for manipulating said sample.

* * * * *

UNITED STATES PATENT AND TRADEMARK OFFICE
CERTIFICATE OF CORRECTION

PATENT NO. : 6,967,335 B1
DATED : November 22, 2005
INVENTOR(S) : Dyer et al.

It is certified that error appears in the above-identified patent and that said Letters Patent is hereby corrected as shown below:

Column 2,
Line 61, replace "her" with -- near --.

Column 9,
Line 58, replace "felation" with -- relation --.

Column 10,
Line 3, replace "100x" with -- 1000X --.

Column 11,
Line 5, replace "colunm" with -- column --.
Line 21, replace "maybe" with -- may be --.
Line 39, replace "c oarse" with -- coarse --.

Column 12,
Line 36, replace "cornprises" with -- comprises --.
Line 49, replace "poitions" with -- portions --.

Column 13,
Line 16, replace "long" with -- longer --.
Line 61, replace "expandible" with -- expandable --.

Column 14,
Line 33, replace "maybe" with -- may be --.

Column 17,
Line 24, replace "maybe" with -- may be --.

UNITED STATES PATENT AND TRADEMARK OFFICE
CERTIFICATE OF CORRECTION

PATENT NO. : 6,967,335 B1
DATED : November 22, 2005
INVENTOR(S) : Dyer et al.

It is certified that error appears in the above-identified patent and that said Letters Patent is hereby corrected as shown below:

Column 18,
Line 30, replace "effeetors" with -- effectors --.
Line 47, replace "coiiform" with -- conform --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,967,335 B1 |
| APPLICATION NO. | : 10/173542 |
| DATED | : November 22, 2005 |
| INVENTOR(S) | : Mark J. Dyer et al. |

It is certified that error appears in the above-identified patent and that said Letters Patent is hereby corrected as shown below:

Column 1, line 5, the following language should be inserted:

STATEMENT OF GOVERNMENT RIGHTS

The invention was made with Government support under Grant DE-FG03-02ER83582 awarded by the United States Department of Energy. The Government has certain rights in this invention.

Signed and Sealed this

Twenty-eighth Day of October, 2008

JON W. DUDAS
*Director of the United States Patent and Trademark Office*